Patent

United States Patent [19]
Goforth et al.

[11] Patent Number: 4,783,603
[45] Date of Patent: Nov. 8, 1988

[54] TTL TO MOS CONVERTER WITH POWER SUPPLY NOISE REJECTION

[75] Inventors: Joseph M. Goforth, San Jose; Elvan S. Young, Santa Clara, both of Calif.

[73] Assignee: Cypress Semiconductor Corporation, San Jose, Calif.

[21] Appl. No.: 1,354

[22] Filed: Jan. 8, 1987

[51] Int. Cl.⁴ .................. H03K 17/16; H03K 19/03; H03K 19/092
[52] U.S. Cl. ................... 307/443; 307/475; 307/469; 307/451
[58] Field of Search ............. 307/443, 475, 264, 549, 307/448, 451, 468, 200 B, 451

[56] References Cited

U.S. PATENT DOCUMENTS

| | | | |
|---|---|---|---|
| 4,305,009 | 12/1981 | Miyagawa et al. | 307/264 |
| 4,547,742 | 10/1985 | Maschek | 330/149 |
| 4,609,836 | 9/1986 | Koike | 307/451 |

Primary Examiner—Stanley D. Miller
Assistant Examiner—Richard Roseen
Attorney, Agent, or Firm—Blakely, Sokoloff Taylor & Zafman

[57] ABSTRACT

An input buffer for coupling TTL logic circuits to CMOS logic circuits, the buffer being used to convert between standard TTL logic signals and CMOS logic signals. The buffer includes a first inverter circuit and a second inverter circuit coupled in a cascade (output of first inverter coupled to the input of the second inverter). The first inverter includes two resistors (Rcc and Rss); the Rcc resistor couples the first inverter to a first reference voltage, which is usually a power supply voltage rail, and Rss couples the first inverter to a second reference voltage. The first inverter also includes a capacitor coupled in parallel with that inverter. Power supply noise is isolated from the first inverter so that the buffer has better immunity from noise than the prior art.

3 Claims, 2 Drawing Sheets

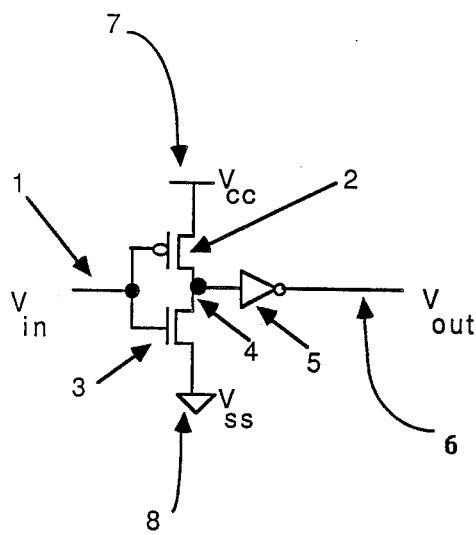
Figure 1-Prior Art Buffer
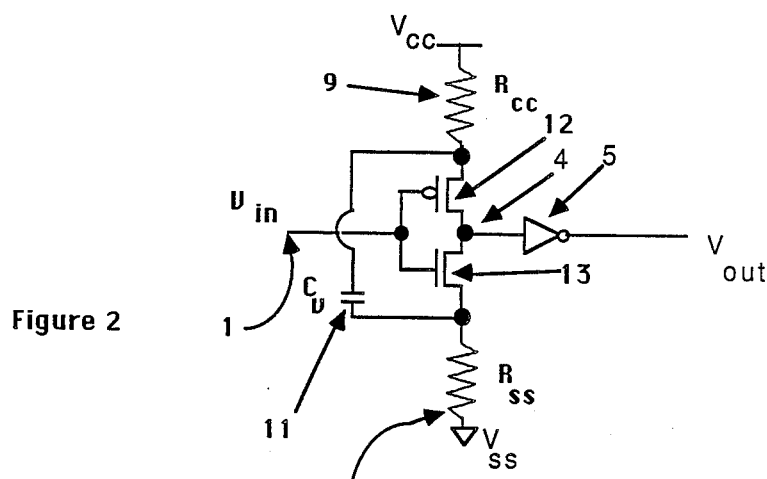
Figure 2
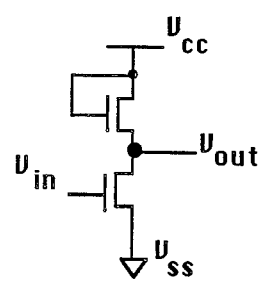
Figure 3a
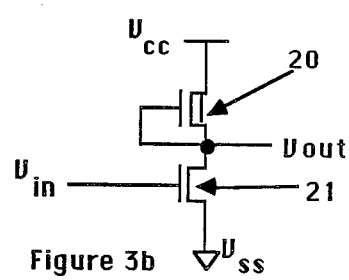
Figure 3b
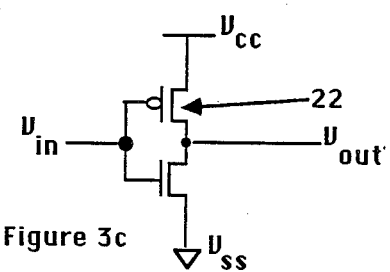
Figure 3c

TTL TO MOS CONVERTER WITH POWER SUPPLY NOISE REJECTION

BACKGROUND OF THE INVENTION

This invention relates to the field of integrated circuits and, in particular, buffers and converters for integrated circuits.

Interfacing between various kinds of circuits, such as TTL, ECL or CMOS typically requires a converter or buffer between the types of circuits. These buffers or converters usually permit one type of circuit, such as TTL, to be coupled to another type of circuit, such as CMOS. These converters or buffers are necessary because one type of circuit will frequently operate at different voltage levels, have different current and drive capabilities, and have other different properties than another type of circuit (e.g. the current driving capacity of one circuit may poorly match with another type of circuit which may require more current to drive it).

These buffers or converters are prone to noise, such as voltage spikes, occurring on the power supply lines. That noise tends to induce false transitions in the converter or buffer which transitions may change the state of logic (such as a 1 to a 0). Solutions to this problem in the prior art have usually attempted to reduce the power supply noise. Such solutions include the decoupling and impedance matching of external power supply rails and the use of dual Vss pins and often the reduction of package inductance. The invention does not focus on reducing power supply noise but rather attempts to isolate it from the input buffer.

FIG. 1 illustrates a conventional input buffer (or converter) which may be used to convert between TTL outputs and CMOS input. That is, the voltage in (Vin) is obtained from a TTL output and appears at 1 of FIG. 1. The voltage out from the buffer, appearing at 6, may now be apppplied to CMOS circuits. This prior art configuration of an input buffer will be discussed in more detail below. The invention permits a simple and inexpensive solution to the problem of power supply noise for input buffers. The invention allows true TTL input levels to drive high speed CMOS integrated circuit devices in electronic systems environments.

SUMMARY OF THE INVENTION

The present invention utilizes a first inverter circuit, the output of which is coupled to the input of a second inverter circuit. The first inverter circuit is coupled to a first reference voltage, usually a power supply voltage (Vcc) by a resistor Rcc. The first inverter circuit is also coupled to a second reference voltage (usually a ground—"Vss") through a resistor Rss. A means for storing a charge is coupled in parallel with the first inverter circuit to receive a charge that is the fraction of the potential difference between the first reference voltage and the second reference voltage. These inverter circuits invert the logical binary state of the input from high to low and vice versa, as is well known in the art.

In one embodiment of the invention, the first inverter circuit is a CMOS inverter having a P-channel MOS transistor and an N-channel MOS transistor, the gates of said P-channel and the N-channel MOS transistors being coupled together and the drains of those transistors being coupled together to form the conventional CMOS inverter circuit. The source of the P-channel transistor is coupled to the first reference voltage (usually, Vcc) through the resistor Rcc. The source of the N-channel MOS transistor is coupled to the second reference voltage (usually, Vss) through the resistor Rss. A means for storing a charge, such as a capacitor, is coupled in parallel across the sources of the respective transistors so the capacitor charges to the value of the voltage across the 2 transistors. The output of the first inverter is fed to the input of the second inverter circuit which then produces an output from the buffer. The buffer is used to interface TTL to CMOS circuits which include CMOS memories (e.g. RAM, FIFOs, ROM, EPROM, PLAS, etc.) and CMOS logic circuits. In the following description, numerous specific details, such as schematic diagrams, voltages, reference values, etc. are set forth for a thorough understanding of the invention. However, it will be obvious to one skilled in the art that the invention may be practiced without the use of these specific details. In other instances, well known circuits are shown in block diagram form in order not to obscure the present invention in unnecessary detail.

DETAILED DESCRIPTION OF THE DRAWINGS

FIG. 1 shows by schematic diagram a prior art input buffer.

FIG. 2 shows an embodiment of an input buffer according to the present invention.

FIG. 3a shows an embodiment of an inverter circuit.

FIG. 3b shows an embodiment of an inverter circuit.

FIG. 3c shows the conventional CMOS inverter circuit.

DETAILED DESCRIPTION OF THE INVENTION

Figure 4:
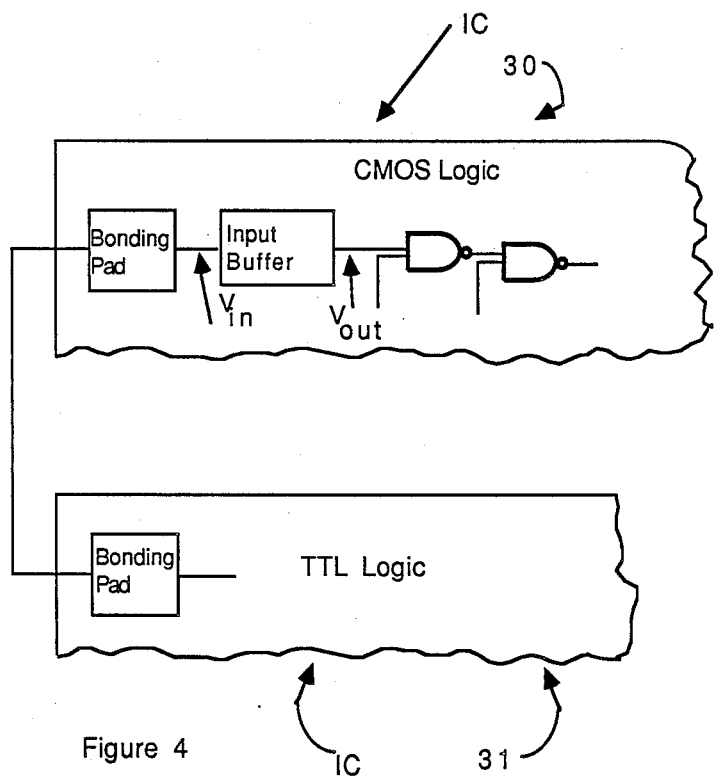
FIG. 4 shows an overview of the invention in electrical systems.

FIG. 1 shows an input buffer or converter found in prior art systems for converting between TTL to CMOS logic. The input signal into the input buffer is connected to line 1 which is coupled to gates of the MOS transistors 2 and 3. MOS transistor 2 is a P-channel MOS transistor (as are MOS transistors 12 and 22 shown in FIG. 2 and FIG. 3c respectively). The gates of MOS transistors 2 and 3 are coupled together as are the drains of those transistors. The source of MOS transistor 2 is coupled to 7, a power supply voltage Vcc, which is often +5 volt. The source of transistor 3 (an n-channel device) is coupled to a second reference voltage 8 (labelled Vss). In a typical implementation the first reference voltage 7 (Vcc) is plus 5 volts and second reference voltage 8 (Vss) is ground. Transistors 2 and 3 of FIG. 1 form the conventional CMOS inverter circuit, the output of which is taken at 4 and is coupled to a second inverter 5. The output from the second inverter 5 is connected to the output of the input buffer and appears at line 6. The TTL to CMOS buffer of FIG. 1 serves to convert TTL logic signals (e.g. "0" logic for 0 to 0.8 volts and "1" for 2.4 to 5 volts) to CMOS compatible logic signals (e.g. "0" logic for 0 to 1.5 Volts and "1" for 1.6 to 5 Volts) for input to CMOS circuits.

The prior art input buffer as shown in FIG. 1, is prone to noise spikes occurring on the power supply lines or on the ground, which spikes tend to cause false transitions of the input buffer, thereby causing errors in the overall system in which the input buffer is a part.

FIG. 2 shows an embodiment of an input buffer/converter according to the present invention. The input buffer of FIG. 2 includes two inverter circuits, a first inverter (formed by MOS transistors 12 and 13) and a second inverter 5. The buffer of FIG. 2 serves to convert TTL logic signals to CMOS compatible logic signals for input to CMOS circuits. The input to the input buffer is received on line 1 which is coupled to both gates of MOS transistors 12 and 13. As noted previously, MOS transistor 12 is a P-channel MOS transistor (as are transistors 2 and 22 shown in FIG. 1 and FIG. 3c respectively). The drains of MOS transistors 12 and 13 shown in FIG. 2 are connected together and they are also connected to the input of the second inverter 5 shown in FIG. 2. The source of the MOS transistor 12 is coupled to a first reference voltage (Vcc) through the resistor 9 (Rcc). The resistor 9 serves to isolate the first inverter circuit from noise spikes and other noise appearing on the first reference voltage (Vcc); typically, Vcc is the power supply voltage which may be at plus 5 volts. Other common power supply voltages which may be used as the first reference voltage, depending on the types of transistors used, include +12 Volts and −5 Volts. The resistor 9 will have a voltage drop across it, which voltage drop will increase proportionally when a noise spike increases Vcc. Thus, Rcc will tend to reduce the effect of an increase in Vcc, such as a voltage spike, at the output of the first inverter circuit, which output is labelled as 4 on FIG. 2.

The resistor 10 (Rss) functions in the same way. That is, when a transient change in voltage in either reference voltage occurs, much of that transient voltage will be taken in the voltage drop across Rcc and Rss. Resistors 9 and 10 (Rcc and Rss respectively) serve to isolate the first reference voltage (Vcc) and the second reference voltage (Vss) from the first inverter circuit which includes the MOS transistors 12 and 13 so that the output from the first inverter circuit at 4 in FIG. 2 is not affected by noise in the reference voltages as much as the input buffer according to the prior art.

Values for Rcc and Rss depend on the types of transistors used (e.g. enhancement mode (transistor 3), deplection mode (transistor 20), resistance of the FETs used in the inverter circuits, etc.) However, the designer should be sure that the values for Rcc and Rss do not alter the logical state (e.g. "0" or "1") of the first inverter circuit at the output of that circuit when compared to the prior art buffers without Rcc and Rss. Rcc and Rss should be sized (in terms of values for resistance) and matched such that the output of the first inverter circuit (with Rcc and Rss in place) will remain within proper logic levels for the input to the second inverter 5 such that a "0" input to the first inverter produces a "1" input (at line 4 of FIG. 2) to the second inverter 5, and vice versa. For example, if Rcc is too large (in resistance) relative to Rss, then the output from the first inverter at 4 (of FIG. 2) may not go high enough (to be within the proper high state) when Vin (at 1 of FIG. 2) is low (0 Volts for positive logic). Similarly, f Rss is too large relative to Rcc, then the output from the first inverter may not go low enough when Vin is high. ("1" for positive logic).

The invention also may include the use of a capacitor or other means for storing a charge. The use of a capacitor is preferred. Referring to FIG. 2, a capacitor 11 (Cv) is coupled in parallel across the sources of MOS transistors 12 and 13 such that the capacitor 11, given enough time in a DC state, will charge to the value of the voltage drop across transistors 12 and 13. The capacitor 11 is used as a charge storage element for charging and discharging the output of the first inverter at 4 of FIG. 2 when the input buffer is operating in the AC state. The capacitor Cv typically has 2 charge carrying plates which are separated by an insulator. The capacitor 11 serves to more rapidly pull the output at 4 of FIG. 2 to ground (or substantially to Vss) when the input buffer receives a changing signal which is changing from low to high in the case of positive logic. It should be noted that the invention integrates the Rcc, Rss and Cv components directly onto the monolithic IC chip having the CMOS circuits for which the buffer interfaces between TTL and CMOS.

It will be appreciated that several inverter circuits may be used in place of the conventional CMOS inverter circuit found in the first inverter circuit of FIG. 2 or in place of the second inverter 5. For example, the different types of inverter circuits shown in FIGS. 3a, 3b, and 3c may be used in place of the first inverter circuit formed by MOS transistors 12 and 13. The MOS transistor 20 shown in FIG. 3b is a depletion N-channel MOS transistor. Of course, if one utilizes the inverter circuits shown in FIGS. 3a, 3b, and 3c the resistors Rcc and Rss would be included as part of the invention and the capacitor Cv is also normally included. In typical implementation of the invention using a conventional CMOS inverter as the first inverter, the resistor Rcc will have a value of about 5 times that of the resistor Rss which typically has a value ranging from 1,000 to 5,000 OHM. Also, the capacitor Cv will have a value of about several pico farads (e.g. 5 pf). These values apply to a conventional CMOS inverter circuit where Vcc= +5 Volts, Vss=ground, the n-MOS device has a threshold voltage ($V_T$) of about +1.0 Volts and the p-MOS device has a $V_T$ of about −1.0 Volts. These values are merely examples which are not intended to limit the scope of the invention.

The use of the invention in a typical system is shown by FIG. 4. The block labeled "input buffer" in FIG. 4 includes the circuit shown in FIG. 2. That input buffer is part of an integrated circuit ("IC") chip 30 which, as shown in FIG. 4, is coupled to another chip 31. It will be appreciated that the circuitry on a semiconductor chip is connected to another semiconductor chip via the bonding pads located on each chip (only 1 bonding pad is shown on each monolithic chip). The input buffer shown on FIG. 4 receives the input from the integrated circuit chip 31 which has TTL logic levels and converts that input to voltage values and current values which are compatible with CMOS logic. Only a portion of IC chips 30 and 31 are shown for simplicity.

What is claimed:

1. An input buffer for a CMOS circuit, said input buffer having an input and an output comprising:
   a CMOS inverter circuit having an input being coupled to the input of said input buffer and having a p-channel MOS transistor and an n-channel MOS transistor, said p-channel MOS transistor having a gate, a source and a drain, said n-channel MOS transistor having a gate, a source and a drain, the gates of said p-channel and said n-channel MOS transistors being coupled together and to the input of the CMOS inverter circuit, and the drains of said MOS transistors being coupled together and to an output of said CMOS inverter circuit;
   a capacitor having two charge carrying plates, one of said plates of said capacitor coupled to the source of said p-channel MOS transistor and the other of said plates of said capacitor coupled to the source of said n-channel MOS transistor;

a first resistor means coupling the source of said p-channel MOS transistor to a first reference voltage source;

a second resistor means coupling the source of said p-channel MOS transistor to a second reference voltage source; and an inverter circuit having an input coupled to the output of said CMOS inverter circuit, said output of said CMOS inverter circuit being coupled to the drains of said MOS transistors, said inverter circuit having an output coupled to an output of said input buffer, whereby an improved input buffer having greater tolerance for noise is obtaianed.

2. An input buffer as in claim 1 wherein said input buffer and said CMOS circuit are disposed on a monolithic IC chip and wherein said first reference voltage source is a power supply voltage for said monolithic IC chip and said second reference voltage source is a ground for said monolithic IC chip.

3. An input buffer for a CMOS circuit on a monolithic IC chip, said input buffer also being disposed on said monolithic IC chip having a first reference voltage and a second reference voltage, said input buffer comprising:

an input to said input buffer;

an output from said input buffer;

a first inverter having an input and an output, the input of said input buffer being coupled to said input of said first inverter circuit, said first inverter circuit having a first terminal and a second terminal;

a second inverter circuit having an input and an output, said input of said second inverter circuit being coupled to the output of said first inverter circuit, and said output of said second inverter circuit being coupled to the output of said input buffer;

a first resistor means being coupled to said first reference voltage and to said first terminal for coupling said first inverter circuit to said first reference voltage through said first resistor means;

a second resistor means being coupled to said second reference voltage and to said second terminal for coupling said first inverter circuit to said second reference voltage through said second resistor means;

a capacitor means having two charge carrying plates, one of said plates being coupled to said first terminal and the other of said plates being coupled to said second terminal such that said capacitor means receives a charge that is a fraction of the potential difference said first reference voltage and said second reference voltage.

* * * * *

UNITED STATES PATENT AND TRADEMARK OFFICE
CERTIFICATE OF CORRECTION

PATENT NO. : 4,783,603

DATED : 11/08/88

INVENTOR(S) : Goforth et al.

It is certified that error appears in the above-identified patent and that said Letters Patent is hereby corrected as shown below:

Col. 03, line 58    delete "f" insert --if--

Signed and Sealed this

Twenty-fourth Day of October, 1989

Attest:

DONALD J. QUIGG

*Attesting Officer*      *Commissioner of Patents and Trademarks*